(12) United States Patent
Qi et al.

(10) Patent No.: US 10,770,498 B2
(45) Date of Patent: Sep. 8, 2020

(54) IMAGE SENSOR WITH METAL GRIDS AND MANUFACTURING METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: De Kui Qi, Shanghai (CN); Fu Cheng Chen, Shanghai (CN); Jue Lu, Shanghai (CN); Xuan Jie Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/108,276

(22) Filed: Aug. 22, 2018

(65) Prior Publication Data
US 2019/0067345 A1    Feb. 28, 2019

(30) Foreign Application Priority Data

Aug. 22, 2017   (CN) .......................... 2017 1 0723132

(51) Int. Cl.
*H01L 27/146* (2006.01)
(52) U.S. Cl.
CPC ...... *H01L 27/1463* (2013.01); *H01L 27/1464* (2013.01); *H01L 27/14621* (2013.01); *H01L 27/14627* (2013.01); *H01L 27/14636* (2013.01); *H01L 27/14689* (2013.01)

(58) Field of Classification Search
CPC combination set(s) only.
See application file for complete search history.

(56) References Cited

U.S. PATENT DOCUMENTS

| 2009/0205851 A1* | 8/2009 | Satoh | G03F 7/2022 |
| | | | 174/250 |
| 2012/0001286 A1 | 1/2012 | Yoon | |
| 2013/0307103 A1* | 11/2013 | Lin | H01L 27/14621 |
| | | | 257/432 |

(Continued)

FOREIGN PATENT DOCUMENTS

CN    106549025 A    3/2017

*Primary Examiner* — Nduka E Ojeh
(74) *Attorney, Agent, or Firm* — Anova Law Group, PLLC

(57) ABSTRACT

A method for manufacturing the image sensor includes providing a substrate structure; forming a mask layer on the substrate structure, the mask layer having openings; depositing a metal grid material covering a surface of the mask layer and a bottom of the openings; and stripping the mask layer for removing a portion of the metal grid material on the top surface of the mask layer. The substrate structure includes: a substrate having a first surface; a plurality of pixels in the substrate; isolation structures around each of the plurality of pixels; and an anti-reflective coating on the first surface of the substrate. The openings include first openings exposing a portion of the first surface of the substrate structure above the isolation structures. A remaining portion of the metal grid material at the bottom of the openings forms metal grids.

11 Claims, 5 Drawing Sheets

(56) References Cited

U.S. PATENT DOCUMENTS

| | | | |
|---|---|---|---|
| 2015/0002719 A1* | 1/2015 | Isono | H01L 27/307 348/311 |
| 2016/0111465 A1* | 4/2016 | Chou | H01L 27/14645 438/70 |
| 2016/0358967 A1* | 12/2016 | Madurawe | H01L 27/14645 |

* cited by examiner

IMAGE SENSOR WITH METAL GRIDS AND MANUFACTURING METHOD THEREOF

CROSS-REFERENCES TO RELATED APPLICATION

This application claims the priority of Chinese Patent Application No. 201710723132.0, filed on Aug. 22, 2017, the content of which is incorporated by reference in its entirety.

TECHNICAL FIELD

The present disclosure generally relates to the technical field of semiconductors, and more particularly, relates to an image sensor and a manufacturing method of the image sensor.

BACKGROUND

As the size of pixel in the image sensor is shrinking, crosstalk noise becomes more serious and the problem caused by crosstalk noise needs to be solved to achieve better image quality.

There are three types of crosstalk in the image sensor: spectral crosstalk, optical crosstalk, and electrical crosstalk. Spectral crosstalk is caused by misalignment of the color filter (CF) and the corresponding pixel. Optical crosstalk is generated when photons enter the adjacent pixels. Electrical crosstalk is caused by the fact that electrons drift to wrong pixels.

One way to reduce spectral crosstalk and optical crosstalk is to insert a color filter into the structure of the metal grid. In prior art, when a metal grid is formed, a metal grid material is deposited first. Then the deposited metal grid material is dry etched to remove the unnecessary metal grid material. Thus, a metal grid corresponding to the pixel region is formed.

The inventor finds that when the deposited metal grid material is subjected to dry etching, some of the plasma with charges is left in the pixel region. The adverse effect will be put on the performance of the image sensor. In addition, the dry etching may also damage the pixel region, which will also affect the performance of the image sensor.

The disclosed devices and methods are directed to at least partially alleviate one or more problems set forth above and to solve other problems in the art.

SUMMARY

One aspect of the present disclosure provides an image sensor and a manufacturing method of the image sensor. The method for manufacturing the image sensor includes providing a substrate structure; forming a mask layer on the substrate structure, the mask layer having openings; depositing a metal grid material covering a surface of the mask layer and a bottom of the openings; and stripping the mask layer for removing a portion of the metal grid material on the top surface of the mask layer. The substrate structure includes: a substrate having a first surface; a plurality of pixels in the substrate; isolation structures around each of the plurality of pixels; and an anti-reflective coating on the first surface of the substrate. A lateral size of an upper half of the openings is smaller than a lateral size of a lower half of the openings. The openings include first openings exposing a portion of the first surface of the substrate structure above the isolation structures. A remaining portion of the metal grid material at the bottom of the openings forms metal grids.

Another aspect of the present disclosure provides an image sensor. The image sensor includes: a substrate structure; a bonding pad on the interconnection structure separated from the third surface; and metal grids on the anti-reflective coating. The substrate structure includes: a substrate having a first surface, a second surface facing the first surface, and a third surface connecting the first surface and the second surface; an interconnect structure under the second surface of the substrate; an insulating layer on the third surface; a plurality of pixels in the substrate; isolation structures around each of the plurality of pixels; an anti-reflective coating on the first surface of the substrate.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Unless specifically stated otherwise, the relative arrangement of the components and steps set forth in these embodiments, and the numerical expression and the numerical value, should not be construed as limiting the scope of the present disclosure.

In addition, it should be appreciated that for ease of description, the size of each part shown in the figure is not necessarily drawn to scale. For example, the thickness or width of certain layers may be exaggerated relative to each other.

The following description of embodiments is merely exemplary and it is not intended to limit the scope of the present disclosure.

The techniques, the methods, or the apparatus, which are well known to those of ordinary skill in the relevant art, may not be discussed in detail. But when applicable, these techniques, methods and apparatus should be considered part of the specification.

It should also be noted that the same reference number or letter indicates the same item in the figures. Thus, once a certain item is defined or illustrated in one of the figures, it will not be further discussed in the description of the other figures.

Figure 1:
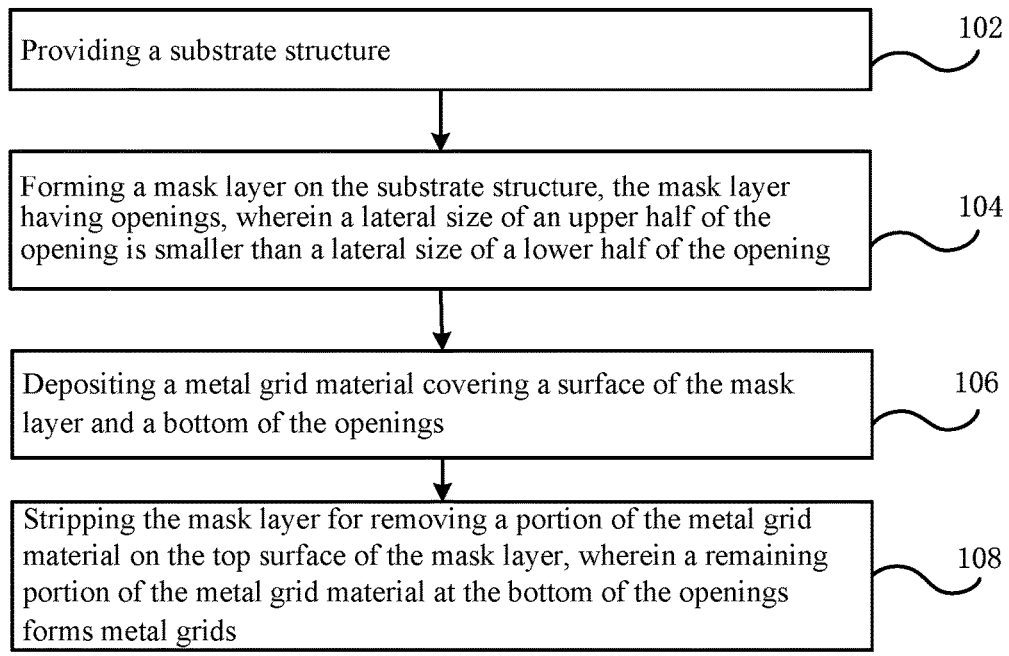
FIG. 1 illustrates a simplified flow chart of an exemplary method for manufacturing an image sensor according to one embodiment of the current disclosure.

FIG. 1 illustrates a simplified flow chart of an exemplary method for manufacturing an image sensor according to one embodiment of the current disclosure. FIGS. 2-10 illustrate schematic diagrams corresponding to certain stages of an exemplary manufacturing process of an image sensor according to some embodiments of the current disclosure.

Detailed descriptions of the manufacturing method of the image sensor according to some embodiments of the current disclosure are introduced with accompanying drawings. The image sensor may be a BSI (back-illuminated sensor) image sensor. The image sensor may include a charge-coupled device (CCD) or a complementary metal oxide semiconductor (CMOS) image sensor (CIS).

As shown in FIG. 1, at S102, a substrate structure is provided. FIGS. 2-6 illustrate an example of corresponding structures.

Figure 2:
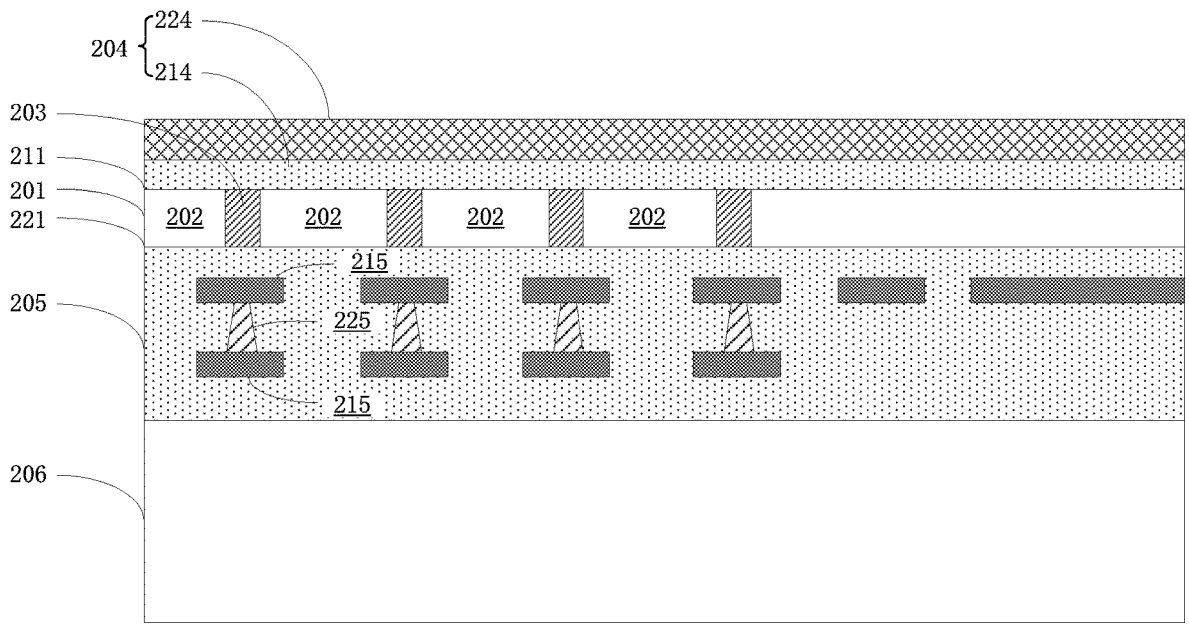
FIGS. 2-10 illustrate schematic diagrams corresponding to certain stages of an exemplary manufacturing process of an image sensor according to some embodiments of the current disclosure.

As shown in FIG. 2, an initial substrate structure is provided.

The initial substrate structure includes an initial substrate 201. The initial substrate has a first surface 211, which is also called a back surface, and a second surface 221, which is also called a front surface. The initial substrate 201 may be an element semiconductor substrate, such as a silicon substrate, a germanium substrate, etc. The initial substrate 201 may be a compound semiconductor substrate, such as gallium arsenide, etc. The initial substrate 201 may be a silicon-on-insulator (SOI) substrate.

The initial substrate structure may also include a plurality of pixels 202 in the initial substrate 201 and isolation structures 203 located around each pixel 202. In one embodiment of the present disclosure, the pixel 202 may include, but not limited to, a photodiode. The isolation structures 203 may be shallow trench isolation structures formed by dielectric materials such as a silicon oxide, a silicon nitride, or other dielectric materials. Each pixel 202 is separated from other pixels by the isolation structures 203. The shape of the isolation structures 203 may vary according to the shape of the pixel 202, e.g., a square ring or a circular ring.

The initial substrate structure may also include an anti-reflective coating 204 on the first surface 211 of the initial substrate 201. In one embodiment, the anti-reflective coating 204 may include a silicon oxide layer 214 on the first surface 211 of the initial substrate 201 and a silicon nitride layer 224 on the silicon oxide layer 214. The anti-reflective coating 204 may also include other materials which may be used for the image sensor.

The initial substrate structure may further include an interconnect structure 205 under the second surface 221 of the initial substrate 201. The interconnect structure 205 may include a metal layer 215 and a connector 225 which connects the different metal layers 215. The interconnect structure 205 may also include an inter-layer dielectric layer 235.

The interconnect structure 205 may be bonded with a carrier substrate 206 from the bottom. In addition, the interconnection structure 205 and the carrier substrate 206 may have a cache layer between them. There are two advantages to have the carrier substrate 206. On one hand, all the components such as pixels 202, etc. on the front surface 221 of the substrate 201 may be protected. On the other hand, mechanical support is provided for the processing of the back surface 211 of the initial substrate 201.

In the practical application, the front surface 221 of the initial substrate 201 may initially be upward. The initial substrate 201 may be turned upside down after the carrier substrate 206 is bonded and the back surface 211 of the initial substrate 201 may be downward. The initial substrate 201 may be thinned to an expected thickness afterward. The reduced thickness may be in a range approximately between 3 microns to 5 microns.

Figure 3:
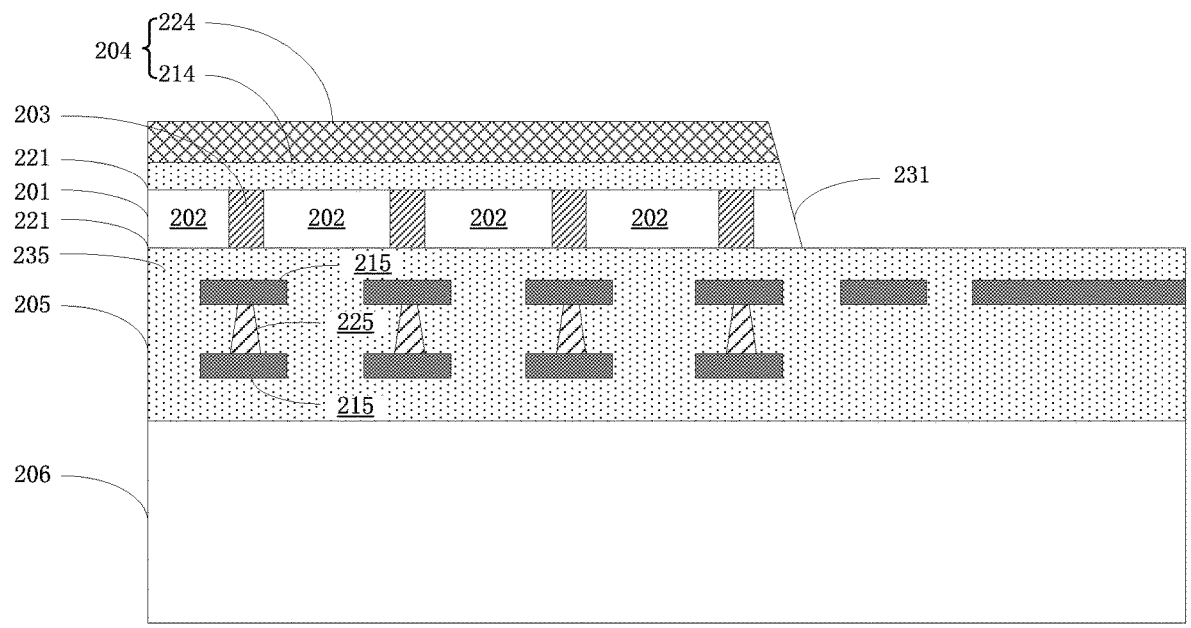

As shown in FIG. 3, a portion of the initial substrate 201 and the anti-reflective coating 204 on the portion of the initial substrate 201 are removed. A portion of the surface of the interconnect structure 205 (i.e., the inter-layer dielectric layer 235) may be exposed and the side surface 231 of the remaining of the initial substrate 201 may be exposed. For example, the anti-reflective coating 204 and a portion of the initial substrate 201 may be etched until the surface of the inter-layer dielectric layer 235 is exposed. The remaining of the initial substrate 201 may be used as the substrate 201 in the formed substrate structure. The side surface 231 of the remaining initial substrate 201 may be used as a third surface of the substrate 201 in the substrate structure. The remaining anti-reflective coating 204 may be used as an anti-reflective coating 204 on the first surface 211 of the initial substrate 201.

Figure 4:
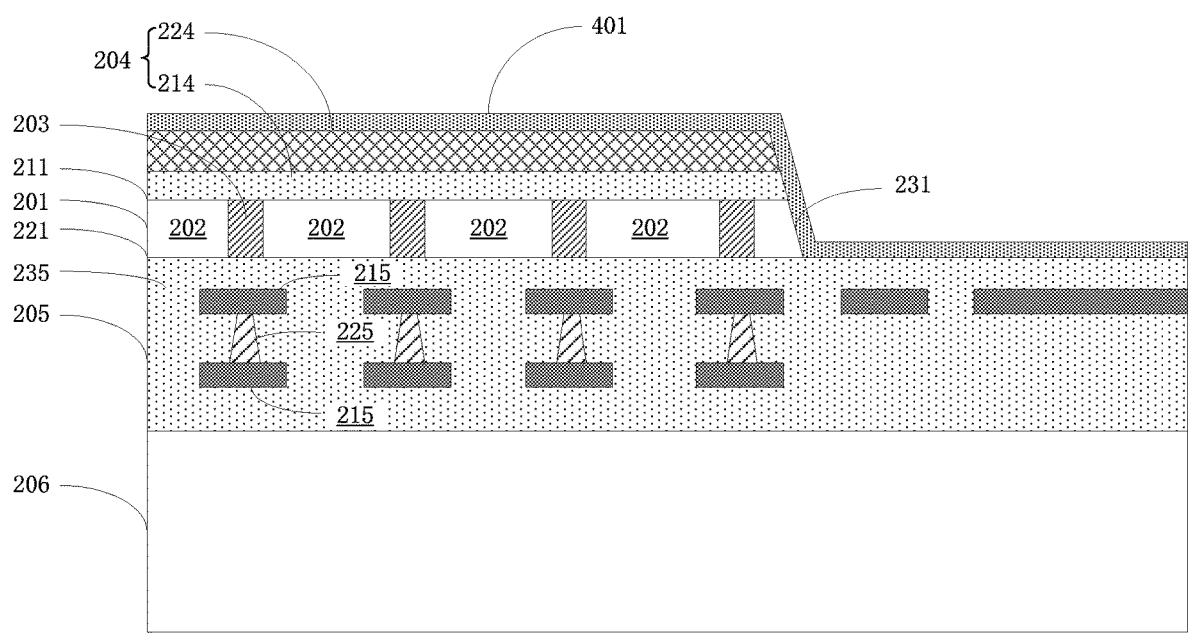

As shown in FIG. 4, an insulating layer 401 may be formed on the third surface 231, and the insulating layer 401 may prevent the subsequently formed metal grid material from being in direct contact with the substrate 201. In one embodiment, the insulating layer 401 may be deposited on the structure shown in FIG. 3. In another embodiment, the insulating layer 401 may be formed on the surface of the third surface 231 by oxidation.

Figure 5:
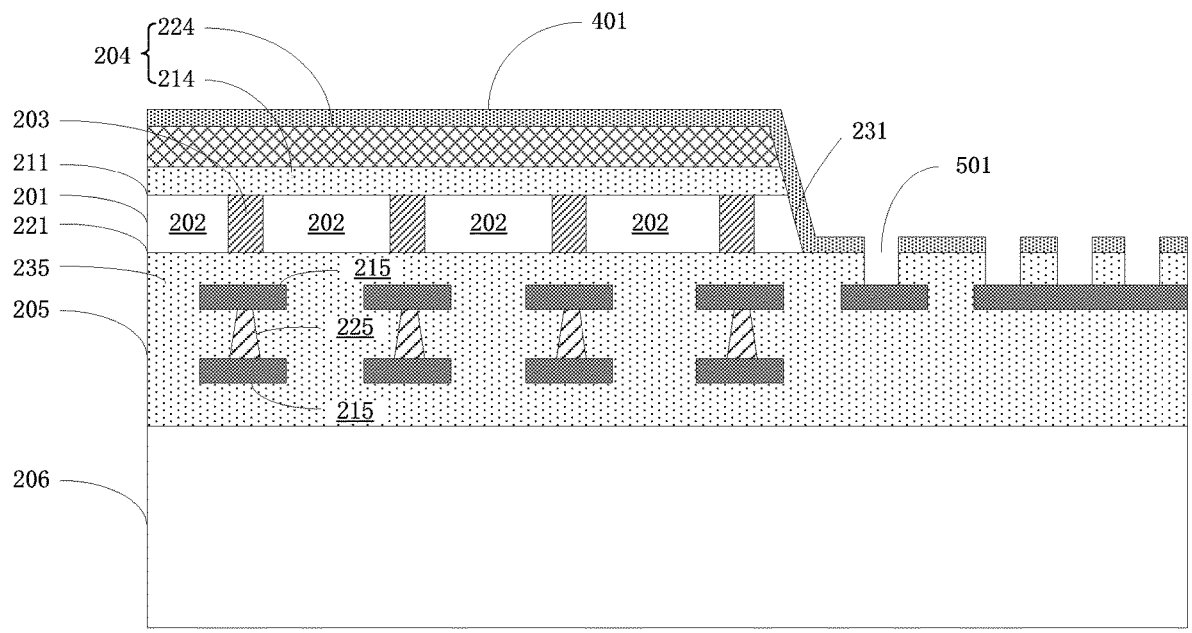

As shown in FIG. 5, through-holes 501 may be formed, which extends to the metal layer 215 and the metal layer 215 is located closest to the surface of the interconnect structure 215 and in the interconnect structure 205.

Figure 6:
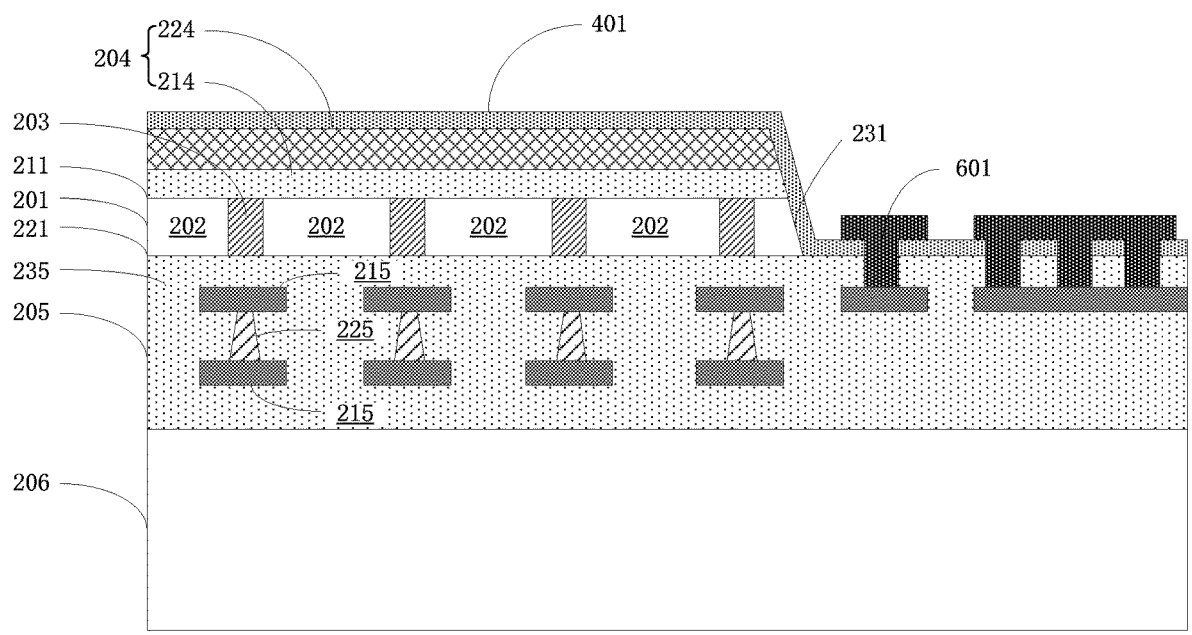

As shown in FIG. 6, a metal material may fill the through-holes 501, and a bonding pad 601 is formed.

In one embodiment, as shown in FIG. 6, the substrate structure may include a substrate 201 having a first surface 211, a plurality of pixels 202 in the substrate 201, isolation structures 203 surrounding each pixel 202, and an anti-reflective coating 204 on the first surface 211 of the substrate 201.

In another embodiment, as shown in FIG. 6, the substrate 201 may further include a second surface 221 on the opposite side comparing to the first surface 211 and a third surface 231 which connects with the first surface 211 and the second surface 231, respectively. An insulating layer 401 may be on the surface of the third surface 231. The substrate structure in the embodiment may further include the interconnection structure 205 under the second surface 221 of the substrate 201 and a bonding pad 601 which is located on the interconnection structure 205 and separated from the third surface 231 of the substrate 201.

The substrate structure may include a carrier substrate 206 under the interconnect structure 205. In addition, the substrate structure may also include additional electric circuits, input and output terminals for providing a working environment for the pixel 202 at the vicinity of the plurality of pixels 202. The structure is not shown in the figures for the sake of brevity.

Figure 7:
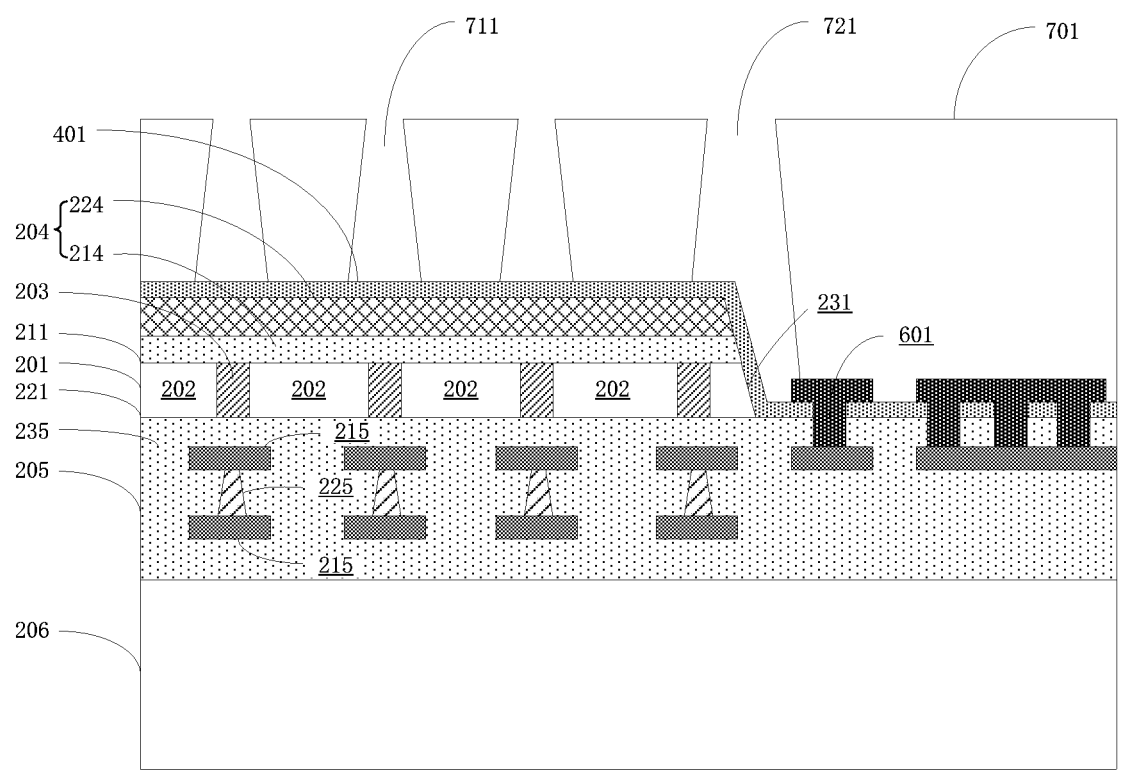

At S104, a mask layer 701 such as a photoresist, etc., which has an opening, is formed on the substrate structure, as shown in FIG. 7. The opening may include a first opening 711 and a second opening 721. The first opening 711 may expose the surface of the substrate structure above the isolation structures 203. The second opening 721 may expose a portion of the pad 601 and the insulating layer 401. It should be noted that the surfaces of the substrate structures may not be the same for different substrate structures. For example, the surface of the substrate structure may be a surface of the anti-reflective coating 204 or may be a surface of the insulating layer 401.

The lateral dimension of the upper half of the opening which includes the first opening 711 and the second opening 721 is less than the lateral dimension of the lower half of the opening. It is appreciated that the opening has a depth in the longitudinal direction and a width in the lateral direction. The lateral dimension of the opening is the width of the opening in the lateral direction. In one implementation, the upper half portion of the opening has a first lateral dimension and the lower half portion has a second lateral dimension which is greater than the first lateral dimension. In another implementation, as shown in FIG. 7, the size of the opening may be gradually increasing from the top to the bottom.

It should be appreciated that the shape of the opening may vary with the shape of the isolation structures 203, such as a square ring or a circular ring.

Figure 8:
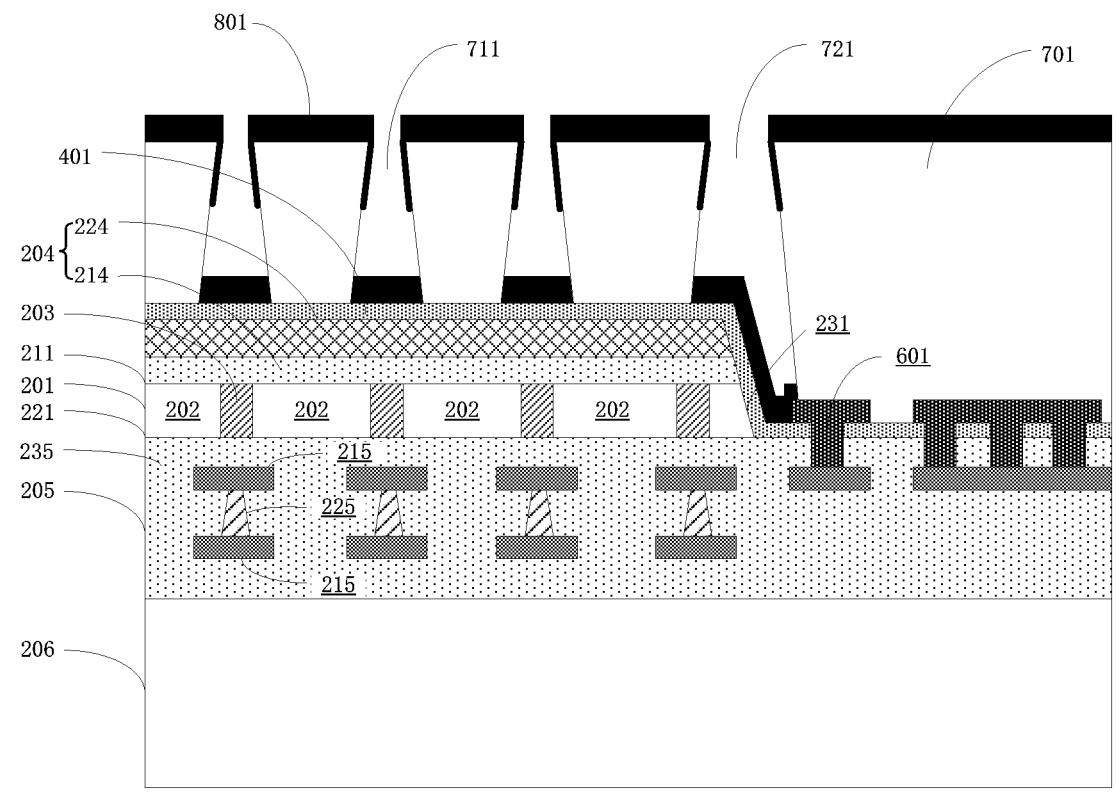

At S106, a metal grid material 801 is deposited, as shown in FIG. 8. The metal grid material 801 may be deposited by a physical vapor deposition (PVD). The metal grid material 801 may include one or more of the following: W, Al, Ti, TiN, Ta, and TaN.

In one embodiment, the metal grid material 801 may cover at least the surface of the mask layer 701 and the bottom of the opening (711,721) of the mask layer 701. The metal grid material 801 at the bottom of the second opening 721 is connected to the bonding pad 601. In another embodiment, the metal grid material 801 may also cover a portion of the side walls of the opening. It should be appreciated that because the lateral dimension of the upper half portion of the opening is smaller than the lateral dimension of the lower half portion, when the metal grid material 801 is deposited, the metal grid material 801 mainly covers the surface of the mask layer 701 and the bottom of the opening (711,721) of the mask layer 701. A portion of the side walls of the opening (the upper portion of the side wall) may also be covered with the metal grid material 801. The metal grid material 801 is separated from the metal grid material 801 at the bottom of the opening.

Figure 9:
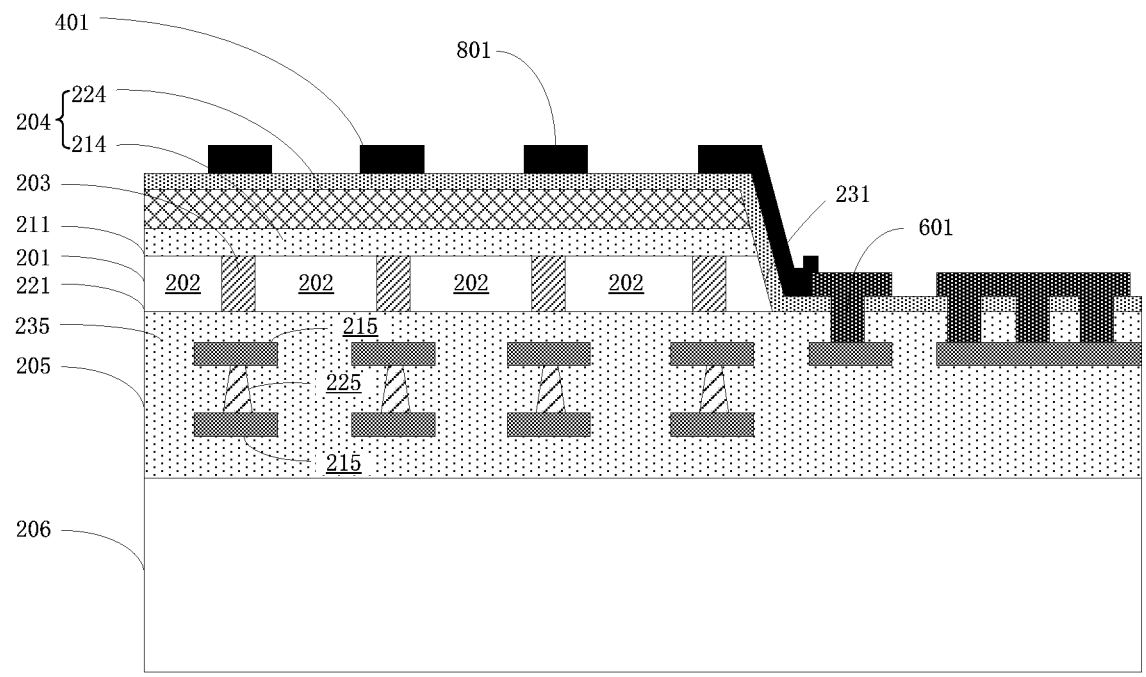

At S108, the mask layer 701 is stripped and the metal grid material 801 on the surface of the mask layer 701 is removed. The metal grid material 801 at the bottom of the opening may be used as the metal grid 801, as shown in FIG. 9. It should be appreciated that when a metal grid material 801 is located on a portion of the side walls of the opening, after stripping the mask layer 701, the metal grid material 801 on the portion of the side walls of the opening is removed.

The metal grid 801 at the bottom of the second opening 721 is in contact with (connected with) the bonding pad 601. Thus, the metal grid 801 may be used not only to block the light, but also to apply voltage to regions other than the pixel region.

Figure 10:
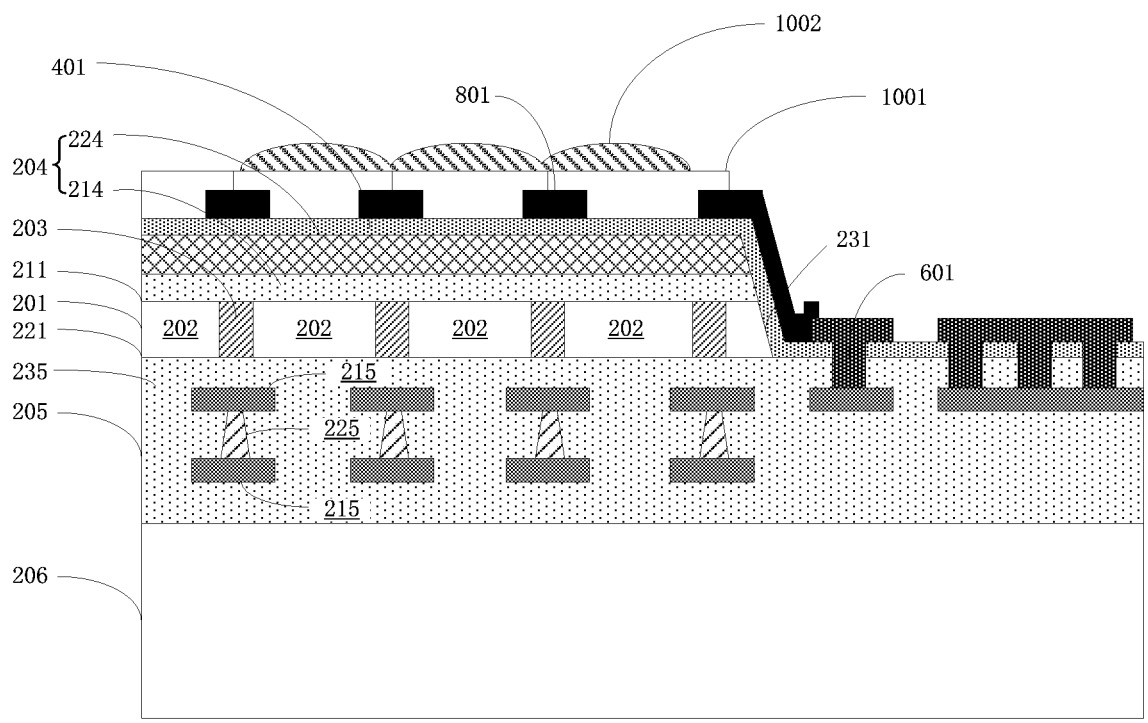

As shown in FIG. 10, a color filter 1001 corresponding to each pixel 202 may be formed in each area surrounded by metal grids 801. A micro lens 1002 may be further formed on the color filter 1001 to guide the incident light into a specific region of the substrate 201, such as the pixel 202.

According to the manufacturing method of the image sensor in the presented disclosure, a dry etching process does not need to be used for forming the metal grid. Instead, the formation of the metal grid is realized by designing the shape of the opening of the mask layer. The lateral dimension of the upper half portion of the opening of the mask is smaller than the lateral dimension of the lower half portion. Therefore, after the metal grid material is deposited, the metal grid may be formed by stripping the mask layer. In one hand, the damage to the pixel area caused by dry etching is avoided. On the other hand, the residual of the charge in the pixel region is also avoided. Thus, the adverse effect of the dry etching on the performance of the image sensor is avoided, and the performance of the image sensor is improved. In addition, the cost is also saved comparing with the method for forming a metal grid by adopting a dry etching process.

The manufacturing method of the image sensor according to the embodiments of the current disclosure has been described in detail. To make the novel point of the present disclosure more clear, some details known in the art are not described, and those of ordinary skill in the relevant art may completely understand how to implement the technical scheme disclosed according to the above description. In addition, embodiments in the disclosure may be combined. The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for manufacturing an image sensor, comprising:
   providing a substrate structure, comprising:
      a substrate having a first surface, wherein the substrate has a second surface facing the first surface and a third surface connecting the first surface and the second surface, an insulating layer is on the third surface, and the substrate structure further includes an interconnect structure under the second surface of the substrate and a bonding pad on the interconnection structure and separated from the third surface;
      a plurality of pixels in the substrate;
      isolation structures around each of the plurality of pixels; and
      an anti-reflective coating on the first surface of the substrate;
   forming a mask layer on the substrate structure, the mask layer having openings, wherein
      a lateral size of an upper half of the openings is smaller than a lateral size of a lower half of the openings, and
      the openings include first openings exposing a portion of the first surface of the substrate structure above the isolation structures;
   depositing a metal grid material covering a surface of the mask layer and a bottom of the openings; and
   stripping the mask layer for removing a portion of the metal grid material on the top surface of the mask layer, wherein a remaining portion of the metal grid material at the bottom of the openings forms metal grids, wherein:
      the openings further include a second opening exposing a portion of the bonding pad and the insulating layer, and
      a portion of the metal grid material on the bottom of the second opening is connected with the bonding pad.

2. The method according to claim 1, further comprising:
   providing an initial substrate structure, the initial substrate structure comprising:
      an initial substrate having a first surface and a second surface;
      the plurality of pixels in the initial substrate;
      the isolation structures around each of the plurality of pixels;
      an initial anti-reflective coating on the first surface of the initial substrate; and
      the interconnect structure under the second surface of the initial substrate;
   removing a portion of the initial substrate and the initial anti-reflective coating on the portion of the initial substrate exposing a portion of a surface of the interconnect structure and a side surface of a remaining portion of the initial substrate, wherein the remaining portion of the initial substrate is the substrate, the side surface of the remaining portion of the initial substrate is the third surface, and a remaining portion of the initial anti-reflective coating is the anti-reflective coating on the first surface of the substrate;

forming the insulating layer on the third surface;

forming through-holes extending in the interconnect structure to a metal layer located closest to the surface of the interconnect structure; and forming the bonding pad by filling the through-holes with a metal material.

3. The method according to claim 1, wherein:

the plurality of pixels includes photodiodes.

4. The method according to claim 1, wherein the image sensor is a back-illuminated sensor.

5. The method according to claim 1, wherein a size of the openings gradually increases from a top of the openings to a bottom of the openings.

6. The method according to claim 1, wherein:

the metal grid material further covers a portion of side walls of the openings, and stripping the mask layer further includes removing a portion of the metal grid material on side walls of the openings.

7. The method according to claim 1, further comprising:

forming a color filter corresponding to each of the plurality of pixels in each area surrounded by metal grids.

8. The method according to claim 7, further comprising:

forming a micro lens on the color filter.

9. The method according to claim 1, wherein:

the metal grid material includes one or more of W, Al, Ti, TiN, Ta, and TaN.

10. The method according to claim 1, wherein:

the metal grid material is deposited by a physical vapor deposition process.

11. The method according to claim 1, wherein the anti-reflective coating includes:

a silicon oxide layer on the first surface of the substrate; and a silicon nitride layer on the silicon oxide layer.

* * * * *